United States Patent [19]

Ferchau et al.

[11] Patent Number: 4,800,463
[45] Date of Patent: Jan. 24, 1989

[54] CIRCUIT BOARD BARRIER GUIDE

[75] Inventors: Joerg U. Ferchau, Morgan Hill; Kenneth A. Kotyuk, San Jose, both of Calif.

[73] Assignee: Tandem Computers Incorporated, Cupertino, Calif.

[21] Appl. No.: 805,510

[22] Filed: Dec. 5, 1985

[51] Int. Cl.⁴ .............................................. H05K 9/00
[52] U.S. Cl. .................................... 361/424; 211/41; 361/415
[58] Field of Search .......... 211/41; 361/381, 383–384, 361/395, 399, 413, 415, 424

[56] References Cited

U.S. PATENT DOCUMENTS 4,597,291 7/1986 Motomiya ............................ 361/395
4,630,175 12/1986 Lerude et al. ....................... 361/424

FOREIGN PATENT DOCUMENTS 0090539 10/1983 European Pat. Off. ............ 361/424
2539480 3/1977 Fed. Rep. of Germany ...... 361/399
866528 4/1961 United Kingdom ................ 361/394

Primary Examiner—A. D. Pellinen
Assistant Examiner—Gregory D. Thompson
Attorney, Agent, or Firm—Townsend and Townsend

[57] ABSTRACT

The invention is directed to a combined guide and barrier for the edge mounting of ciruit boards within a housing. The barrier guides are designed to be used in multiples in high density packing applications. The barrier guide includes a top, a bottom and a barrier extending between the top and bottom. The top and bottom have opposed grooves facing one another. The grooves guide and position the printed circuit within the housing. The barrier, positioned near and parallel to the grooves and extending along the length of the top and bottom, helps prevent the user from inadvertently coming into contact with exposed edge connectors or adjacent circuit boards after a circuit board is removed from the housing. The barrier also guides cooling air through the housing.

6 Claims, 2 Drawing Sheets

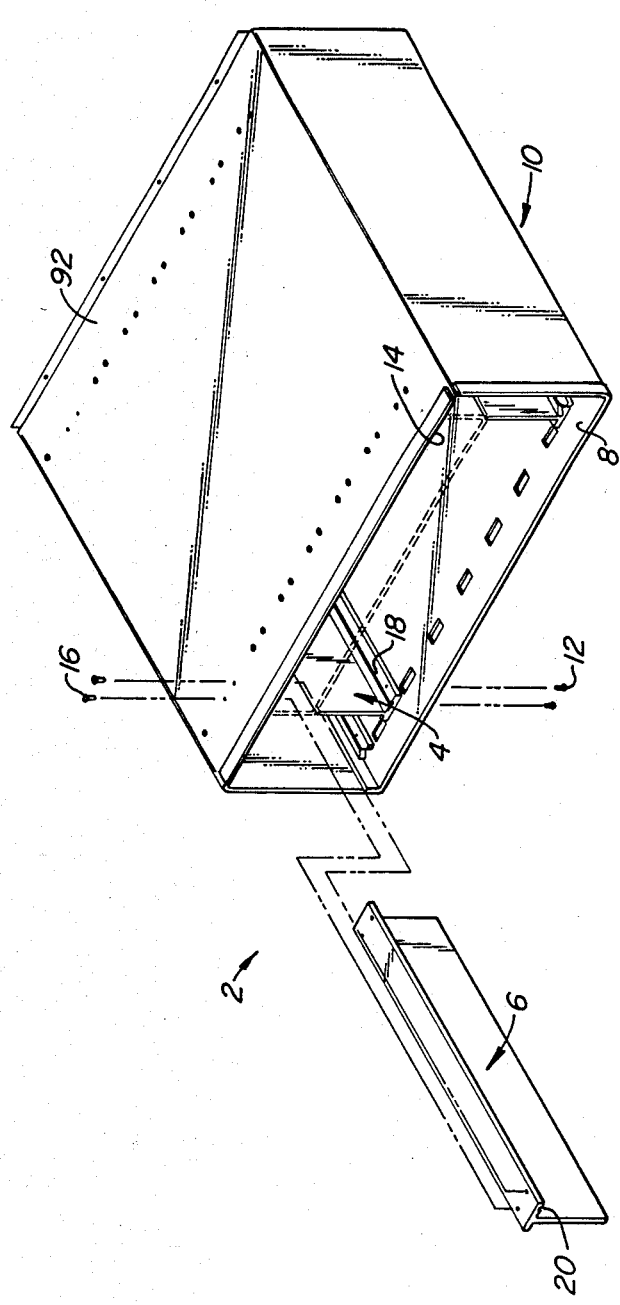

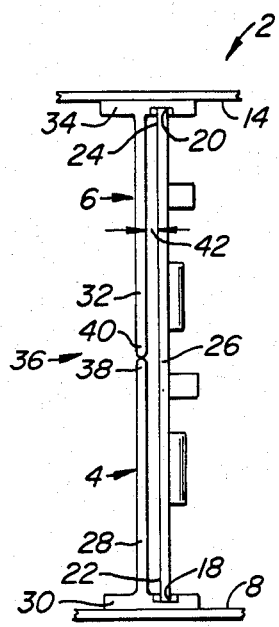
FIG._2.
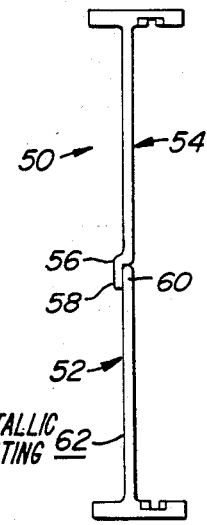
FIG._3.
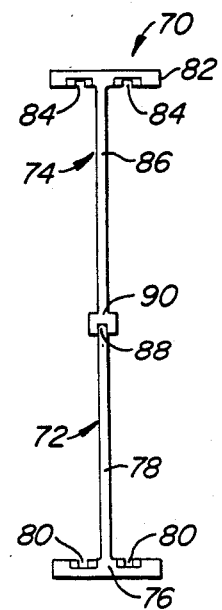
FIG._4.
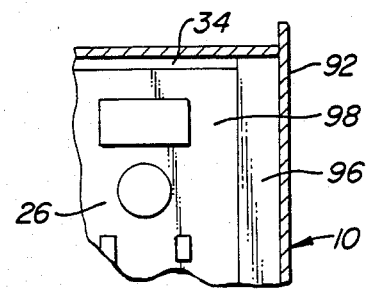
FIG._5.

CIRCUIT BOARD BARRIER GUIDE

BACKGROUND OF THE INVENTION

Computers, even though they use efficient integrated circuits, can require substantial amounts of power. This electrical power is provided by specially designed power supplies. These power supplies, especially those used with large computers, create substantial amounts of heat which must be dissipated. This is often done by blowing air past the circuit boards of the power supply.

To aid the repair of a power supply with a defective component, the various components are often mounted to a number of circuit boards which are individually removable from the power supply housing. One way this is done is by slidably mounting the circuit boards in rows within the power supply housing. During removal and replacement of the circuit boards from and into the housing, the boards can be guided along their upper and lower edges by tabs or other guide elements extending from the upper and lower surfaces of the housing. The circuit boards preferably have contacts at their outer edges which engage complementary contacts of an electrical connector mounted within the housing.

Certain computers are made with redundant components. Therefore if one or more components on one circuit board fail, that circuit board can be removed while the computer, and thus the power supply, continues to operate. One of the problems with such a continuously operational computer is that the power supply often has very high voltages present at the connectors to which the removed circuit board had previously been engaged. The high voltages create a safety hazard to a technician working to repair the power supply. To help prevent the technician from injury, protective partitions or panels have been mounted in the power supply housing adjacent the printed circuit boards. The panels extend to positions near the connectors to which the circuit boards connect. These panels, which remain within the housing when the board is removed for servicing, help to prevent accidental injury to the technician by partially blocking inadvertent contact with the adjacent circuit boards, which are still energized, during servicing. The panels also help to guide cooling air blown through the housing to help insure proper cooling of the circuit board components.

The guide elements used previously were typically formed by deforming the top and bottom surfaces of the housing. This was done by partially punching out short sections of the housing and bending them to create short circuit board and partition guide elements. This method was somewhat limiting in that later rearrangement or repositioning of the circuit boards could only be done by reworking the housing or building a new housing. The partially punched out and bent members limit how close the circuit boards and panels could be mounted to one another. Also, the punched out openings allow cooling air to escape through the housing which lowers the cooling efficiency of the system.

Another type of guide elements used to support side-by-side slidably mounted protective panels and circuit boards, is a plastic card guide. These commercially available card guides are elongate strips mounted to the upper and lower surfaces of the housing with a central groove formed therein. The edges of the circuit boards are housed within the slots to support and guide the circuit boards. These guide elements, however, restrict how close one can mount the partitions to the circuit boards which can reduce the packing density below that desired. They are also time consuming to install.

SUMMARY OF THE INVENTION

The invention is directed to a circuit board barrier guide for mounting a circuit board, having first and second edges, in a housing. The barrier guide includes an elongated base including a first support groove for receipt of the first edge therein and an elongate top having a second support groove facing the first support groove for receipt of the second edge therein. An elongate barrier extends between the base and the top. The barrier is positioned near the first and second grooves to form a channel between it and the circuit board mounted within the support grooves.

A primary advantage of the present invention is that it allows circuit boards and their associated barriers to be custom mounted anywhere within the power supply housing. The barriers and circuit boards need not be positioned at locations considered appropriate when the power supply housing was manufactured, as occurs when the guide members are bent tabs. With the present invention the circuit board barrier guides are simply mounted within the housing, typically using screws, rivets, adhesives and so forth. Another advantage of the invention over the prior art is that the distance between the circuit board and the barrier can be any desired distance. There are no inherent limitations as to how close the two can be to each other, as can occur when the guide members are partially punched out, bent tabs or are separate plastic card guides.

A further advantage of the invention is that the size of the guide slots can be very accurately controlled to provide a smooth but snug sliding fit of the boards within these slots to help limit lateral movement. Compared with the use of plastic card guides and separate removable barriers the invention uses fewer parts, required less assembly time and reduces the overall cost of the power supply.

The barrier guides are preferably extruded from nonconductive plastic. To keep the cost down, the barrier guide can be extruded in two pieces. The two-piece design may be such that each is identical so a single portion is useful for both the top and bottom portions. Also, especially when electromagnetic interference (EMI) shielding is desired, the barrier guides may be made of two extrusions with the abutting, adjacent edges of the barrier portions overlapping. EMI shielding can be used to permit denser packing and to permit use in high radiation environments. For EMI shielding, portions of the barrier can have a metallic coating placed thereon; alternatively, or in addition, a fine metallic mesh can be mounted to or embedded within the barrier. The barrier can be made from a conductive plastic for enhanced EMI shielding as well.

Other features and advantages of the present invention will appear in the following description in which the preferred embodiments have been described in detail in conjunction with the accompanying drawings.

BRIEF DESCRIPTION OF THE DRAWINGS

FIG. 1 shows one of a number of two-part circuit board barrier guides being mounted within a power supply housing.

FIG. 2 is an outer end view of the barrier guide of FIG. 1 with a circuit board mounted thereto.

FIG. 3 is an end view of an alternative embodiment of the barrier guide of FIGS. 1 and 2.

FIG. 4 is another alternative embodiment of the barrier guide of FIGS. 1 and 2.

FIG. 5 is a partial side view of the inner end of the barrier guide and circuit board of FIG. 2.

DETAILED DESCRIPTION OF THE PREFERRED EMBODIMENT

Referring now to FIGS. 1 and 2, a printed circuit barrier guide 2 is shown to include a lower barrier guide portion 4 and an upper barrier guide portion 6. Lower portion 4 is shown secured to the lower surface 8 of a housing 10 by screws 12. Housing 10, in the preferred embodiment, is a power supply housing; however the invention can be used with other circuit board housings as well. Screws 12 can be replaced by rivets, adhesives or some other suitable attachment element. The upper portion 6 is shown to be mountable to upper surface 14 of housing 10 by screws 16. Lower and upper portions 4, 6 include opposed slots 18, 20 size for the slidable engagement of the lower and upper edges 22, 24 of circuit board 26. Slots 18, 20 are sized so that edges 22, 24 slide smoothly within them and yet provide reasonable stability for board 26.

Lower barrier guide portion 4 includes a lower barrier 28 extending from a base 30, while upper barrier guide portion 6 includes an upper barrier 32 extending from a top 34. Lower and upper barriers 28, 32 together constitute a barrier 36. Lower and upper barriers 28, 32 include outer ends 38, 40 which are rounded and adjacent one another. Slots 18, 20 are positioned along base 30 and top 34 so that a desired distance 42 between barrier 36 and board 26 is created.

Lower and upper guide portions 4, 6 are identical; upper guide portion 6 is merely turned upside down with respect to lower guide portion. Since barrier guide 2 is preferably extruded, this allows the barrier guide to be extruded at a lower cost compared with the cost of one large extrusion. Barrier guide 2 can be molded or cast instead of extruded and may be a single, unitary member if desired.

Referring now to FIG. 3, an alternative circuit board barrier guide 50 is shown to include a lower portion 52 and an upper portion 54. Portion 52 is similar to portion 4, while portion 54 is similar to portion 6, with the exception that its outer end 56 includes an offset 58 which vertically overlaps the outer end 60 of lower portion 52. This configuration is useful when EMI shielding is critical. To provide EMI shielding, barrier guide 50 has an appropriate metallic coating on its surface 62, surface 62 being grounded to housing 10 in some conventional manner.

FIG. 4 shows a further PC board barrier guide 70 including lower and upper portions 72, 74. Lower portion 72 is similar to lower portion 4, except that its base 76 extends equally distant on either side of its lower barrier 78 and contains a lower groove 80 on each side of lower barrier 78. Similarly, top 82 includes a top groove 84 on either side of upper barrier 86 of upper portion 74. The outer end 88 of lower barrier 78 is plain and rounded as are outer ends 60 and 58. However, the outer end 90 of upper barrier 86 is grooved for receipt of outer end 88 so that, like the embodiment of FIG. 3, enhanced EMI shielding can be provided.

In use, lower and upper portions 4, 6 are mounted to surfaces 8, 14, typically at the manufacturer. Boards 26 are then inserted into slots 18, 20. The entrance ends of slots 18, 20 are flared to help guide printed circuit board 26 into the slots. If a printed circuit board 26 needs to be removed by the user, the board is slid out from slots 18, 20 and the necessary repairs or tests are made. However, since barrier 36 remains in place, the hot or live elements of the adjacent circuit board 26 are shielded from inadvertent contact by the technician. The tested or repaired board 26 is then reinserted into slots 18, 20 and slid along the slots until its terminals (not shown) at its outer edge 98 (FIG. 5) contact the terminals of a connector 96 at back end 92 of housing 10.

Modification and variation can be made to the disclosed embodiments without departing from the subject invention as defined in the following claims.

We claim:

1. A circuit board barrier guide for mounting a circuit board, having first and second edges, in a housing comprising:
    an elongate base including a first support groove for receipt of the first edge therein;
    an elongate top having a second support groove facing a first support groove for receipt of the second edge therein; and
    an elongate, planar barrier including first and second barrier portions, the base and the first barrier portion being a unitary extruded piece, the first and second barrier portions including respective first and second outer edges positioned adjacent one another and configured for complementary mating engagement with portions overlapping, the barrier spaced apart from the first and second grooves a chosen distance to form a channel between the barrier and a circuit board.

2. The barrier guide of claim 1 wherein the top and second barrier portion is a unitary extruded piece and wherein the base and first barrier portion is identical to the top and second barrier portion.

3. The barrier guide of claim 2 wherein the top and second barrier portion are positioned upside down with respect to the base and first barrier portion.

4. The barrier guide of claim 1 wherein the base includes a third groove positioned on a side of the barrier opposite the first groove.

5. The barrier guide of claim 1 wherein the barrier is constructed to act as an electromagnetic radiation shield.

6. The barrier guide of claim 5 wherein the barrier is made of plastic with a lower of metal to create the electromagnetic radiation shield.

* * * * *